(12) United States Patent
Ikeura et al.

(10) Patent No.: US 6,781,282 B1
(45) Date of Patent: Aug. 24, 2004

(54) LONGITUDINALLY COUPLED RESONATOR-TYPE SURFACE ACOUSTIC WAVE DEVICE

(75) Inventors: Mamoru Ikeura, Ishikawa-ken (JP); Hideya Horiuchi, Nagaokakyo (JP); Junya Ago, Toyama-ken (JP); Michio Kadota, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/407,577

(22) Filed: Apr. 4, 2003

(30) Foreign Application Priority Data

Apr. 4, 2002 (JP) ........................................ 2002/102224

(51) Int. Cl.[7] .................................................. H03H 9/25
(52) U.S. Cl. .................... 310/313 B; 333/186; 333/193; 333/194
(58) Field of Search ...................... 310/313 B; 333/186, 333/193, 194

(56) References Cited

U.S. PATENT DOCUMENTS

| 4,604,623 A | * | 8/1986 | Skeie ............................. 342/51 |
| 5,790,000 A | * | 8/1998 | Dai et al. ..................... 333/193 |

FOREIGN PATENT DOCUMENTS

| JP | 62-219709 | 9/1987 | .......... H03H/9/145 |
| JP | 09-260996 | 10/1997 | .......... H03H/9/145 |

* cited by examiner

Primary Examiner—Thomas M. Dougherty
(74) Attorney, Agent, or Firm—Keating & Bennett, LLP

(57) ABSTRACT

A longitudinally coupled resonator-type surface acoustic wave device includes interdigital transducers including a plurality of electrode fingers disposed along the propagation direction of a surface acoustic wave on a surface acoustic wave device. An electrically discontinuous portion is provided in a central portion, in the finger overlap direction, in adjacent electrode fingers in adjacent interdigital transducers, and at least one floating electrode is disposed in the finger overlap direction in the electrically discontinuous portion.

9 Claims, 16 Drawing Sheets (RELATED EXAMPLE)    LENGTH OF FLOATING ELECTRODE b / LENGTH OF DISCONTINUOUS PORTION a to# LONGITUDINALLY COUPLED RESONATOR-TYPE SURFACE ACOUSTIC WAVE DEVICE

BACKGROUND OF THE INVENTION

1. Field of the Invention

The present invention relates a longitudinally coupled resonator-type surface acoustic wave device and more particularly, to a longitudinally coupled resonator-type surface acoustic wave device in which the configuration of electrode fingers of adjacent IDTs (interdigital transducers) is improved.

2. Description of the Related Art

Recently, resonator-type surface acoustic wave devices in which unnecessary modes causing ripples are suppressed have been demanded.

Conventionally, in longitudinally coupled resonator-type surface acoustic wave devices, since a transverse mode causes ripple, a method for applying weighting to IDTs, for example, in accordance with finger overlaps (the amount of overlap of the electrode fingers along the length of electrode finger of IDT), i.e. apodization weighting, has been used to suppress transverse modes. However, when a transverse mode is suppressed by applying weighting to IDTs, the effect on the principal propagation mode is large, and accordingly it is difficult to obtain the desired filtering characteristics.

On the other hand, in a surface acoustic wave resonator described in Japanese Examined Patent Application Publication No. 6-85492, the finger overlap of electrode fingers of the IDTs is set to be 65% to 75% of the electrode finger length in order to suppress ripples caused by a transverse mode. Furthermore, in a resonator-type surface acoustic wave filter described in Japanese Unexamined Patent Application Publication No. 9-260996, the finger overlap of the electrode fingers of the IDTs set to 75% to 85% of the overall electrode finger length to suppress ripples caused by a transverse mode.

As described in Japanese Examined Patent Application Publication No. 6-85492 and Japanese Unexamined Patent Application Publication No. 9-260996, when the ratio of the finger overlap of the electrode fingers to the overall electrode finger length is reduced, the area where a surface acoustic wave is excited is reduced which adversely effects the propagation mode.

SUMMARY OF THE INVENTION

To overcome the problems described above, preferred embodiments of the present invention provide a longitudinally coupled resonator-type surface acoustic wave device in which the effect on the principal propagation mode and transverse modes are effectively suppressed.

According to a preferred embodiment of the present invention, a longitudinally coupled resonator-type surface acoustic wave device includes a surface acoustic wave substrate, and a plurality of IDTs, each having a plurality of electrode fingers, which are arranged in the propagation direction of a surface acoustic wave on the surface acoustic wave substrate. In the longitudinally coupled resonator-type surface acoustic wave device, an electrically discontinuous portion is provided in a central portion, in the finger overlap direction (the vertical direction in FIG. 1), in adjacent electrode fingers of adjacent IDTs and at least one floating electrode is provided in the finger overlap direction in the electrically discontinuous portion.

In a longitudinally coupled resonator-type surface acoustic wave device of preferred embodiments of the present invention, the ratio b/a is preferably at least about 0.575, where the length in the finger overlap direction of the electrically discontinuous portion is designated by a and the length in the finger overlap direction of the floating electrode is designated by b. Then, not only a ripple caused by a transverse mode is effectively suppressed, but also the reduction of insertion loss on the high frequency side in the passband is prevented.

According to a second preferred embodiment of the present invention, a longitudinally coupled resonator-type surface acoustic wave device includes a surface acoustic wave substrate, and a plurality of IDTs which are arranged in the propagation direction of a surface acoustic wave on the surface acoustic wave substrate. In the longitudinally coupled resonator-type surface acoustic wave device, in one electrode finger of adjacent IDTs, an electrically discontinuous portion is provided in a central portion in the finger overlap direction.

In a longitudinally coupled resonator-type surface acoustic wave device of preferred embodiments of the present invention, each of the electrode finger portions on both sides in the finger overlap direction of the electrically discontinuous portion is connected to adjacent IDTs. Therefore, a portion which is excited, a portion which is not excited, and a portion which is excited are disposed in the finger overlap direction in that order in the electrode fingers where an electrically discontinuous portion is provided and a transverse mode is greatly suppressed.

In a longitudinally coupled resonator-type surface acoustic wave device of preferred embodiments of the present invention, the length in the finger overlap direction of the electrically discontinuous portion is at least about $0.6\lambda$. Accordingly, a transverse mode is more effectively suppressed.

In a longitudinally coupled resonator-type surface acoustic wave device of preferred embodiments of the present invention, the length in the finger overlap direction of the electrically discontinuous portion is about 7.5% to about 87.5% of the finger overlap. Accordingly, a transverse mode is more effectively suppressed.

In a longitudinally coupled resonator-type surface acoustic wave device of preferred embodiments of the present invention, the surface acoustic wave substrate includes two opposing end surfaces at which a surface acoustic wave is reflected. Therefore, an end surface reflection type surface acoustic wave device in which adverse effects on the principal propagation mode are minimized and a transverse mode is effectively suppressed is obtained.

In a longitudinally coupled resonator-type surface acoustic wave device of preferred embodiments of the present invention, a plurality of longitudinally coupled resonator-type surface acoustic wave devices may be connected in series, however, at least one of the devices must be a longitudinally coupled resonator-type surface acoustic wave device according to preferred embodiments of the present invention so as to suppress a transverse mode.

Furthermore, in another preferred embodiment of the present invention, a communication device includes a longitudinally coupled resonator-type surface acoustic wave device according to the above-described preferred embodiments of the present invention which defines a bandpass filter. Since a longitudinally coupled resonator-type surface acoustic wave device, in which adverse effects on the principal propagation mode are minimized and a transverse mode is effectively suppressed, is provided as a bandpass filter, a communication device having outstanding communication capabilities is provided.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described.

Figure 1:
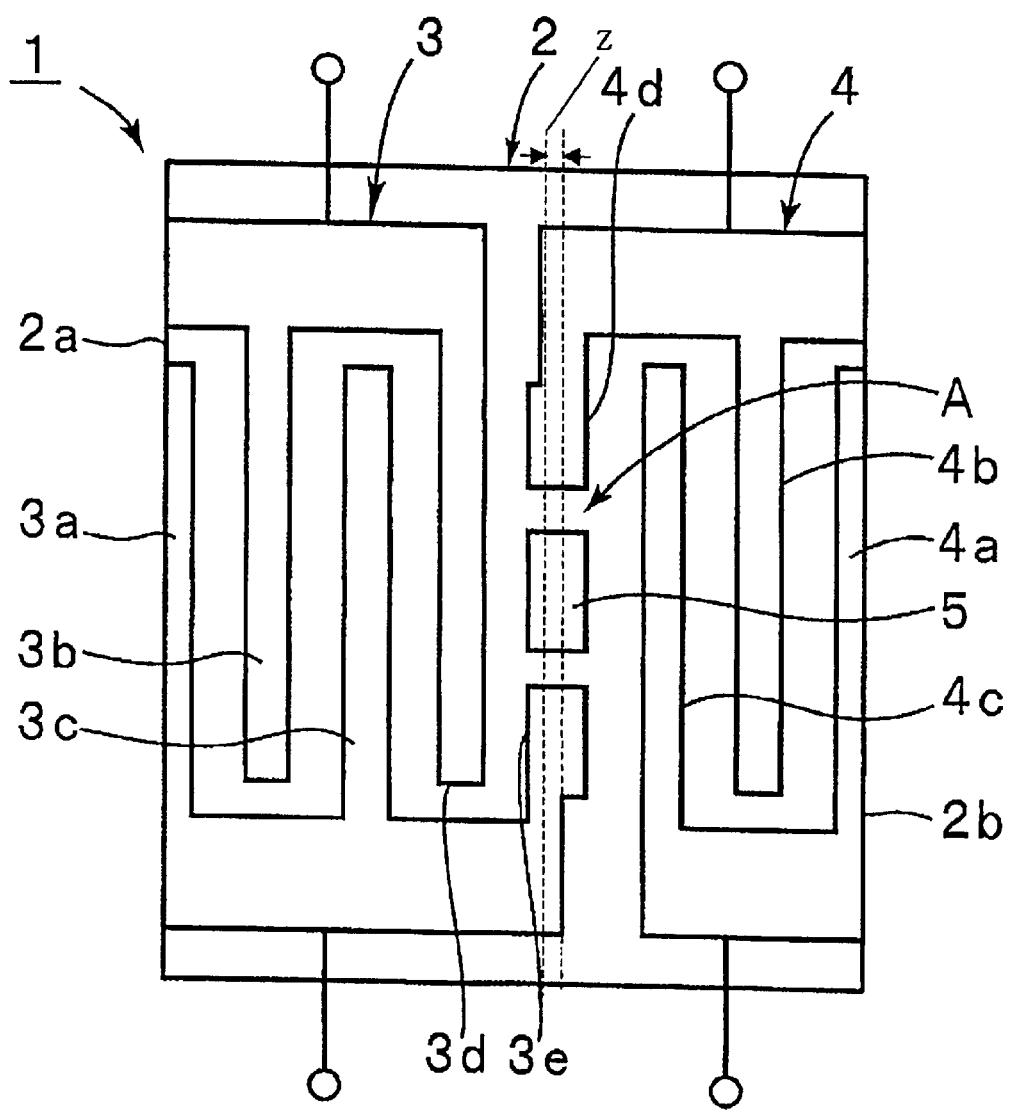
FIG. 1 is a schematic top view of a longitudinally coupled resonator-type surface acoustic wave device according to a first preferred embodiment of the present invention.

FIG. 1 is a schematic top view showing a longitudinally coupled resonator-type surface acoustic wave filter according to a first preferred embodiment of the present invention.

The longitudinally coupled resonator-type surface acoustic wave filter 1 includes a substantially rectangular surface acoustic wave substrate 2. The surface acoustic wave substrate 2 may be made of a piezoelectric substrate, a piezoelectric substrate on which a piezoelectric thin film is provided, or an insulating substrate on which a piezoelectric thin film is laminated. A piezoelectric single crystal such as $LiTaO_3$, $LiNbO_3$, quartz, etc., or piezoelectric ceramics such as lead titanate zirconate can be used as the piezoelectric material of the piezoelectric substrate. A $Ta_2O_3$ or ZnO thin film, or other suitable material, can be used as the piezoelectric thin film.

The surface acoustic wave substrate 2 has a flat, substantially rectangular shape and has two opposing end surfaces 2a and 2b. The end surfaces 2a and 2b define reflecting surfaces which cause a surface acoustic wave to be reflected. That is, the longitudinally coupled resonator-type surface acoustic wave device of the present preferred embodiment is an end surface reflection-type surface acoustic wave device.

IDTs 3 and 4 are provided on the surface acoustic wave substrate 2. The IDTs 3 and 4 are made of a metal film such as aluminum, or other suitable metal film, and, in the present preferred embodiment, the IDTs 3 and 4 are provided on the surface acoustic wave substrate 2 which is preferably made of a piezoelectric substrate. If the surface acoustic wave substrate 2 includes a piezoelectric thin film laminated on an insulating substrate or a piezoelectric substrate, the IDTs 3 and 4 may be arranged so as to be in contact with either the upper surface or lower surface of the piezoelectric thin film.

The IDTs 3 and 4 include a plurality of electrode fingers 3a to 3e and 4a to 4d. A surface acoustic wave propagates in a direction that is substantially perpendicular to the electrode fingers, that is, in the direction extending between the end surfaces 2a and 2b. The electrode fingers 3a and 4a that are outermost in the propagation direction of the surface acoustic wave are arranged along the edges defined by the end surfaces 2a and 2b and the upper surface. Furthermore, the width of the electrode fingers 3a and 4a is about $\lambda/8$, where the wavelength of the surface acoustic wave is $\lambda$. The other electrode fingers 3b to 3e and 4b to 4d have a width of about $\lambda/4$. Furthermore, the distance in the area between the electrode fingers is about $\lambda/4$ in the propagation direction of the surface acoustic wave. Accordingly, the metallization ratio of the IDTs 3 and 4 is about 0.5.

Furthermore, the distance between the IDTs 3 and 4, that is, the distance Z between the centers of the electrode fingers, which are the closest to each other, of the IDTs 3 and 4 is about 0.20λ.

The IDT 3 is an input-side IDT where the number of pairs of electrode fingers is preferably 3.5, and the IDT 4 is an output-side IDT where the number of pairs of electrode fingers is preferably 2.5. Furthermore, the finger overlap of electrode fingers is set to about 8λ in both IDTs 3 and 4.

The present preferred embodiment includes an electrically discontinuous portion A provided between the electrode fingers 3e and 4d in the finger overlap direction, that is, in the direction that is substantially perpendicular to the surface acoustic wave propagation direction in the portion where the IDTs 3 and 4 are adjacent to each other, and that a floating electrode 5 is provided in the electrically discontinuous portion A.

Figure 3:
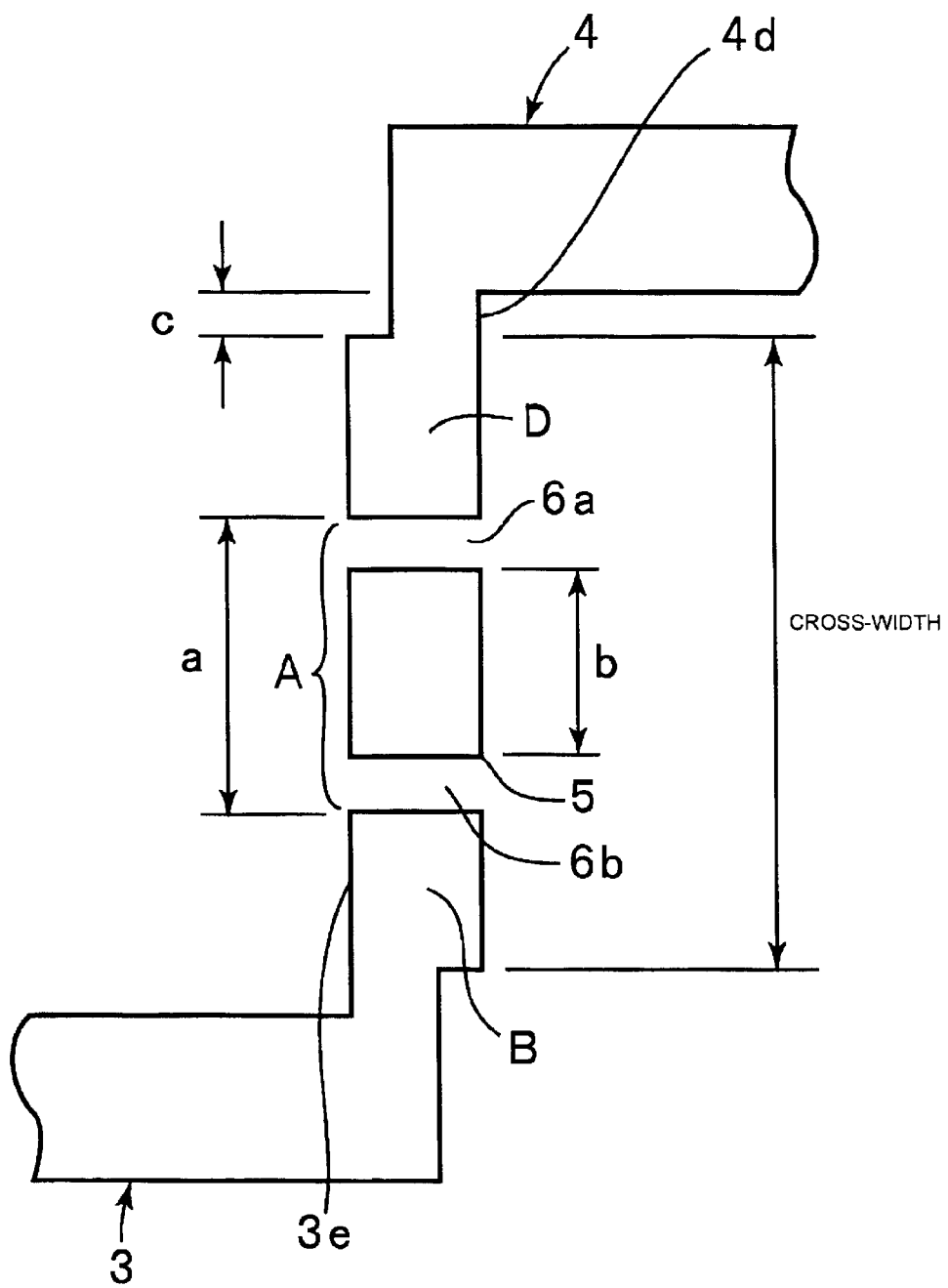
FIG. 3 is an enlarged partially cutaway view showing an electrically discontinuous portion of the longitudinally coupled resonator-type surface acoustic wave device according to the first preferred embodiment of the present invention.

That is, as shown in FIG. 3, an electrode finger portion B which is excited, the discontinuous portion A which is not excited, and an electrode finger portion D which is excited are arranged to extend in the finger overlap direction of electrode fingers in the portion where the electrode fingers 3e and 4d are provided. The electrically discontinuous portion A is defined by the floating electrode 5 and gaps 6a and 6b on both sides in the finger overlap direction of the floating electrode 5.

In the longitudinally coupled resonator-type surface acoustic wave device 1, since the electrically discontinuous portion A and the floating electrode 5 are included, transverse modes are effectively suppressed without adversely effecting the principal propagation mode. This will be described based on specific experimental examples.

Figure 2:
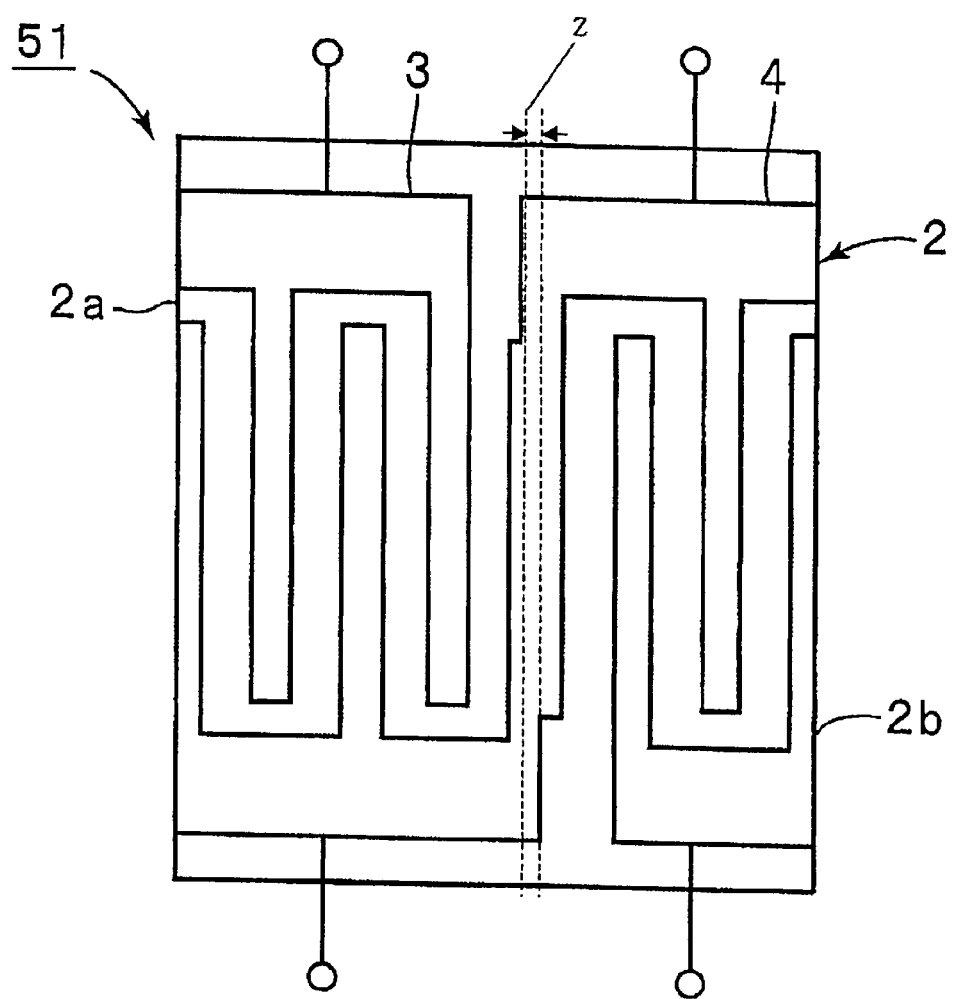
FIG. 2 is a schematic top view of a longitudinally coupled resonator-type surface acoustic wave device as a related example prepared for comparison.

For comparison, a longitudinally coupled resonator-type surface acoustic wave device 51, which is constructed in the same manner as the above-described preferred embodiment except that no electrically discontinuous portion A and floating electrode 5 are provided, was prepared. In FIG. 2, the distance z between the centers of the electrode fingers which are arranged outermost in the IDTs 3 and 4 is about 0.20λ. The electrode fingers are connected and not separated.

Furthermore, various surface acoustic wave devices were produced such that the length c shown in FIG. 3 is about 0.35λ and such that the length a in the finger overlap direction in the discontinuous portion A is 1λ, 2λ, 3λ, 4λ, 7λ, and 8λ+2c. Moreover, the length c in the formula a=8λ+2c represents a space between the outer edge on the finger overlap area and the bus-bar, as shown in FIG. 3. Accordingly, the formula of a=8λ+2c corresponds to a configuration in which a floating electrode finger having the same length as the finger overlap and gaps 6a and 6b having the length c on both sides of the floating electrode finger are provided.

The transmission characteristics of each surface acoustic wave device obtained as described above are shown in FIGS. 4 and 5.

Figure 4:
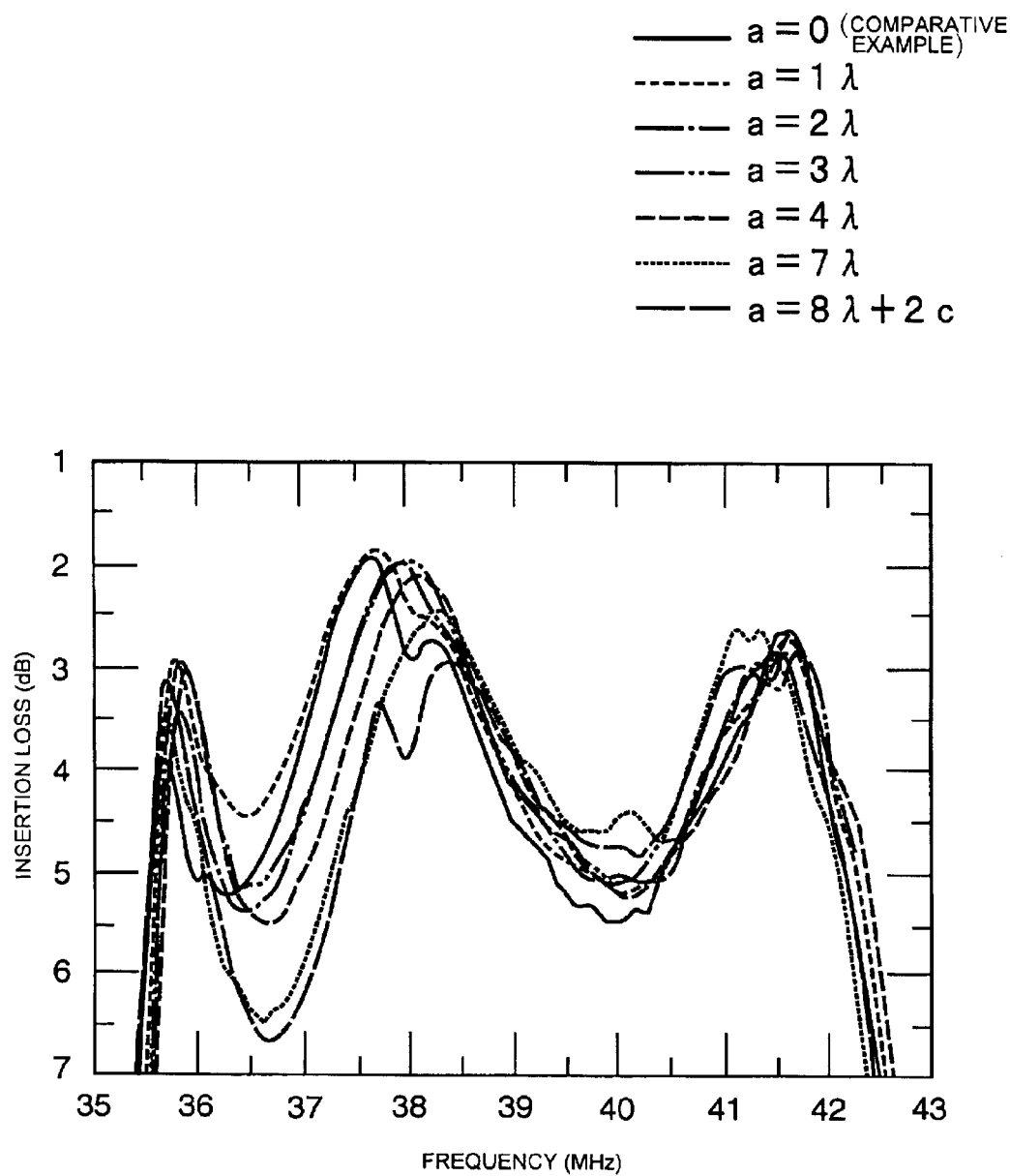
FIG. 4 is a graph for showing the change in transmission characteristic when the length a of the electrically discontinuous portion is changed.
Figure 5:
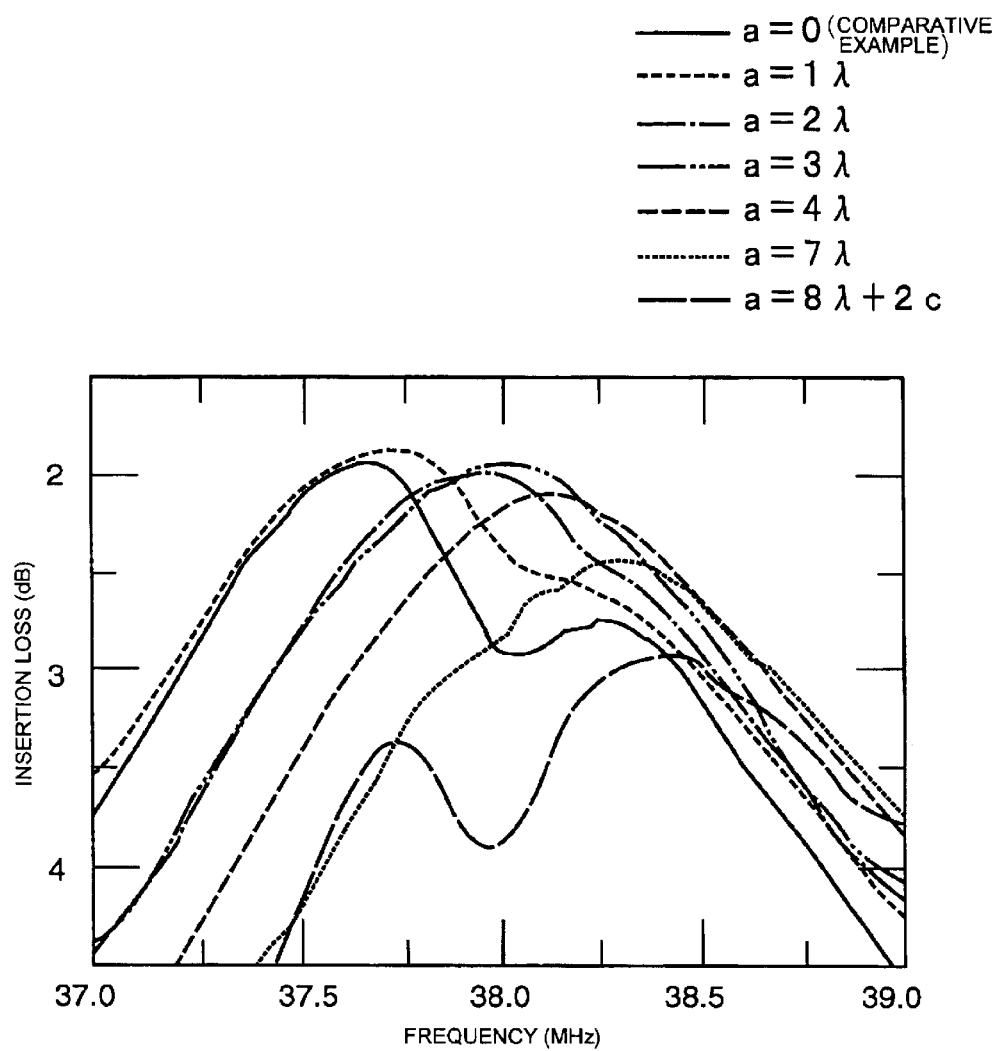
FIG. 5 is an enlarged view of the data in FIG. 4, which shows the change in transmission characteristic when the length a of the electrically discontinuous portion is changed.

As is clear from FIGS. 4 and 5, in the case of a Comparative Example, that is, a=0, a ripple caused by a transverse mode exists in the vicinity of 38.0 MHz, which is close to the response at 37.7 MHz. On the other hand, when the length a is increased, the frequency of the mode in the vicinity 37.7 MHz is shifted to the higher frequency side and a ripple does not exist in the vicinity of 38.0 MHz. That is, the longitudinal and transverse modes overlap each other in the vicinity of a=3λ and very few ripples are seen. Furthermore, when the length a is greater than 3λ, the ripple exists on the lower frequency side of the response of the principal propagation mode.

Figure 6:
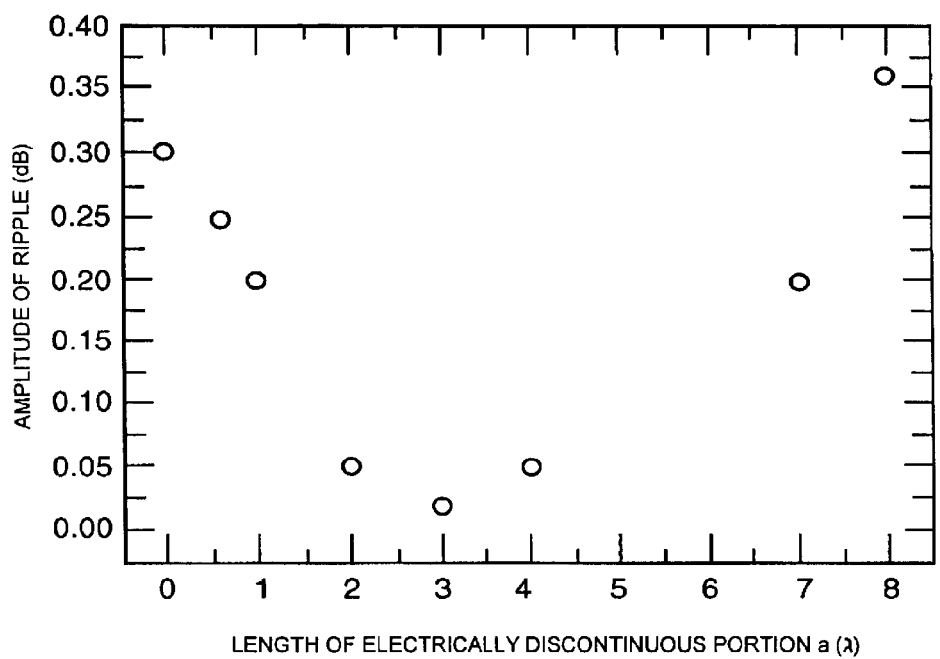
FIG. 6 shows the relationship between the length a of the electrically discontinuous portion and a ripple appearing in the attenuation versus frequency characteristic.

The data in FIGS. 4 and 5 show results for measurements made without performing impedance matching in order to make it easier to understand the relationship between modes. FIG. 6 shows the relationship between the length a and the amplitude of the ripples when impedance matching is performed, and FIG. 7 shows the relationship between the length a and the amplitude of the ripples which exist in the GDT (group delay time) characteristics.

Figure 8:
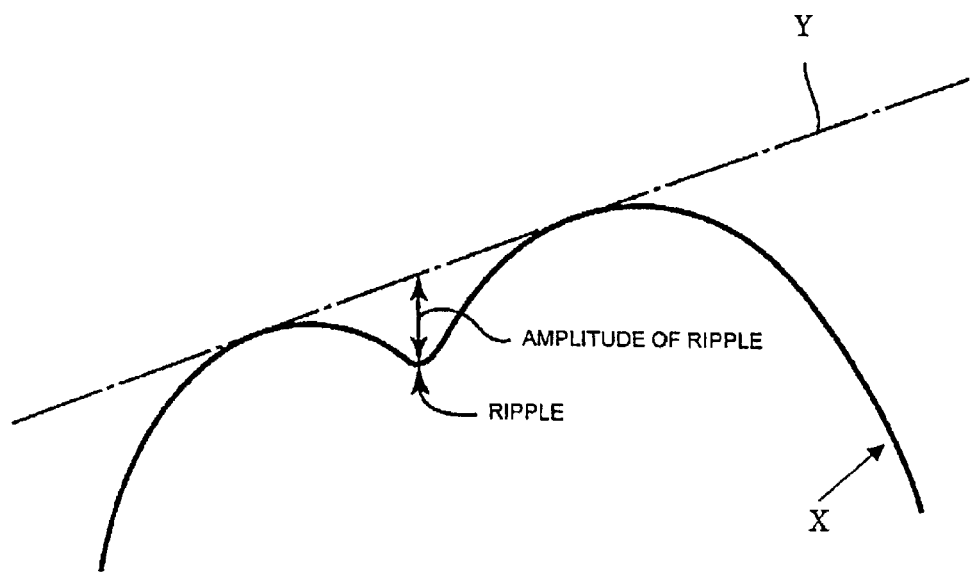
FIG. 8 is a schematic view for describing the evaluation of the amplitude of the ripple shown in FIG. 6.

Moreover, the ripple amplitude in FIG. 6, in the transmission characteristics curve X as shown in FIG. 8, represents the amount of insertion loss between a portion in which a ripple exists and an imaginary line Y connecting the peaks on both sides of the portion in which the ripple exists.

Figure 7:
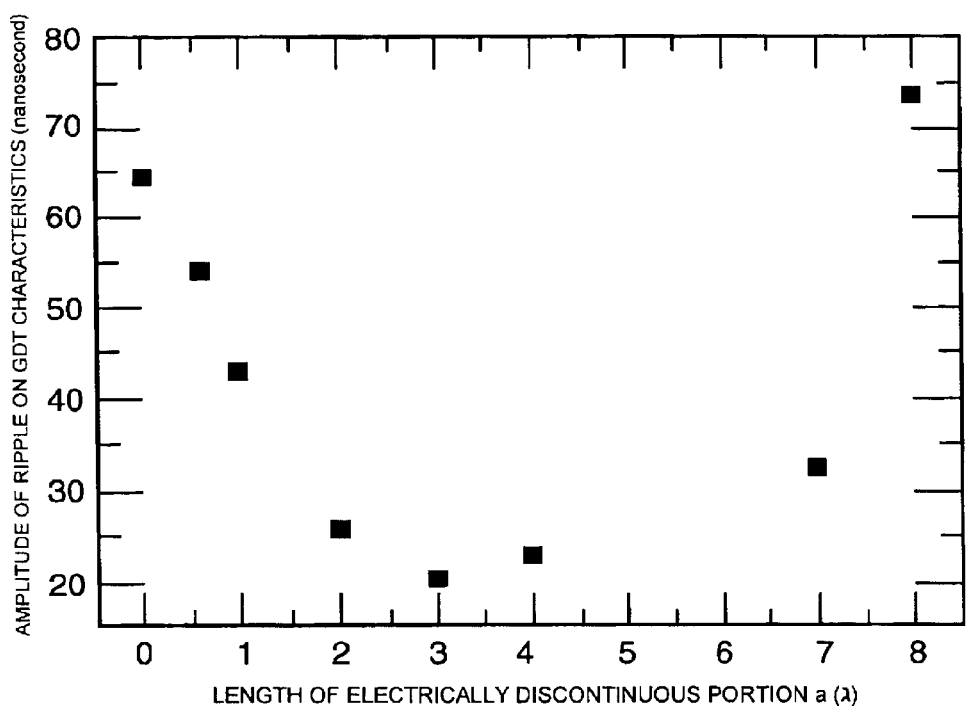
FIG. 7 shows the relationship between the length a of the electrically discontinuous portion and a ripple appearing in the GDT characteristic.

As is clearly seen in FIGS. 6 and 7, when the length a is about 0.6λ to about 7.0λ, that is, about 7.5% to about 87.5% of the finger overlap, a ripple which caused by a transverse mode is effectively suppressed. In the same manner, the ripple existing in the GDT characteristics is effectively suppressed.

Figure 9:
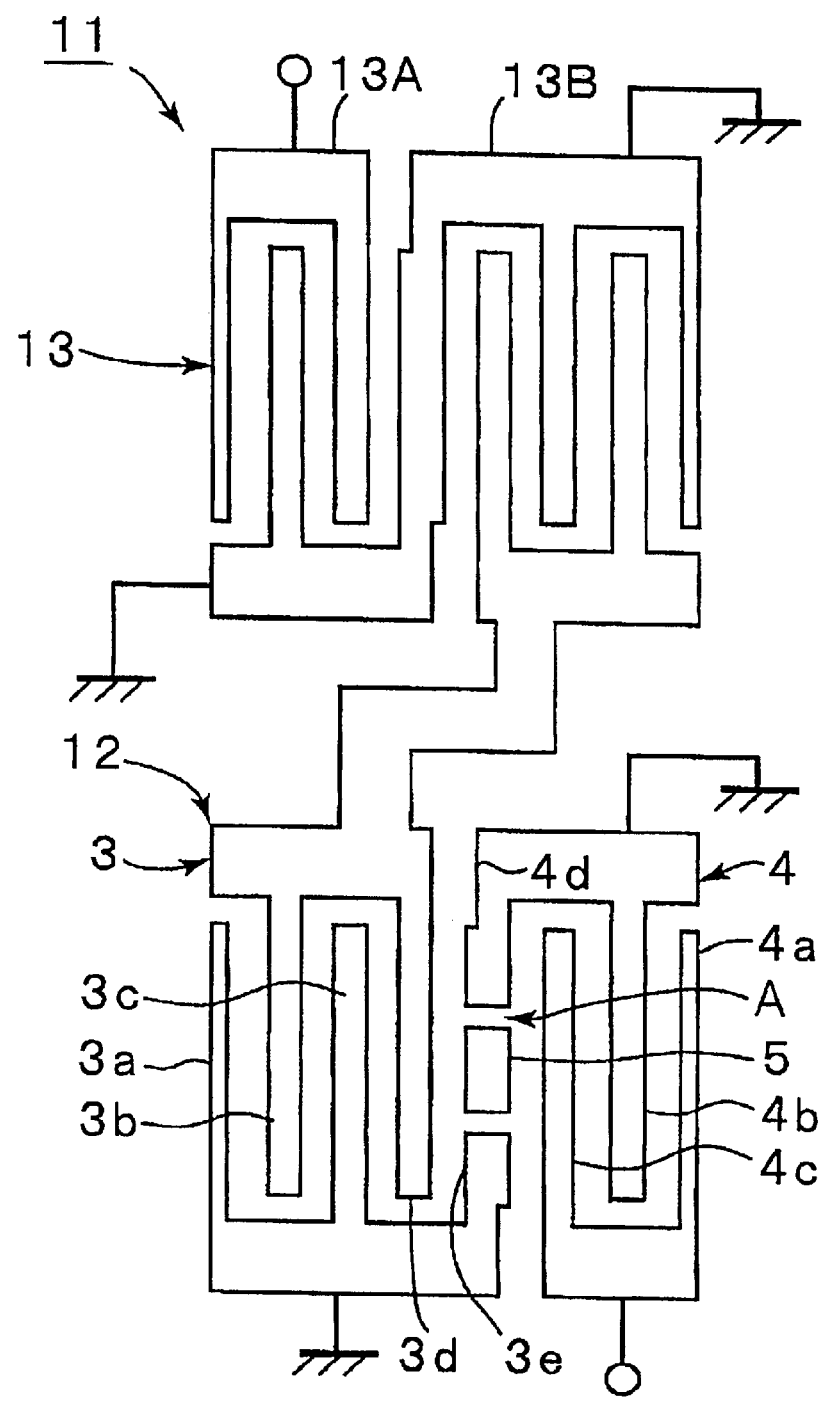
FIG. 9 is a schematic top view showing the construction of electrodes in a longitudinally coupled resonator-type surface acoustic wave device according to a second preferred embodiment of the present invention.

FIG. 9 is a schematic top view showing the configuration of electrodes of a resonator-type surface acoustic wave device according to a second preferred embodiment of the present invention.

In the longitudinally coupled resonator-type surface acoustic wave device 11 according to the second preferred embodiment, a longitudinally coupled resonator-type surface acoustic wave filter portion 13 having no electrically discontinuous portion is connected in the front stage of a longitudinally coupled resonator-type surface acoustic wave filter portion 12, which is defined by the IDTs 3 and 4. That is, the two longitudinally coupled resonator-type surface acoustic wave filter portions are connected in series.

The longitudinally coupled resonator-type surface acoustic wave filter portion 13 is preferably constructed in the same manner as the longitudinally coupled resonator-type surface acoustic wave filter portion 12 except that the longitudinally coupled resonator-type surface acoustic wave filter portion 13 includes no electrically discontinuous portion and the number of pairs of electrode fingers in an IDT 13A on the input side is preferably 2.5 and the number of pairs of electrode fingers in an IDT 13B is preferably 3.5. The longitudinally coupled resonator-type surface acoustic wave filter portion 12 is constructed in the same manner as the longitudinally coupled resonator-type surface acoustic wave filter 1.

In a longitudinally coupled resonator-type surface acoustic wave device of preferred embodiments of the present invention, a plurality of longitudinally coupled resonators type surface acoustic wave devices are preferably connected in series as in the longitudinally coupled resonator-type surface acoustic wave device 11 of the second preferred embodiment. In this case, an electrically discontinuous portion is required in only at least in one longitudinally coupled resonator-type surface acoustic wave filter according to preferred embodiments of the present invention to effective suppress a ripple caused by a transverse mode.

Figure 10:
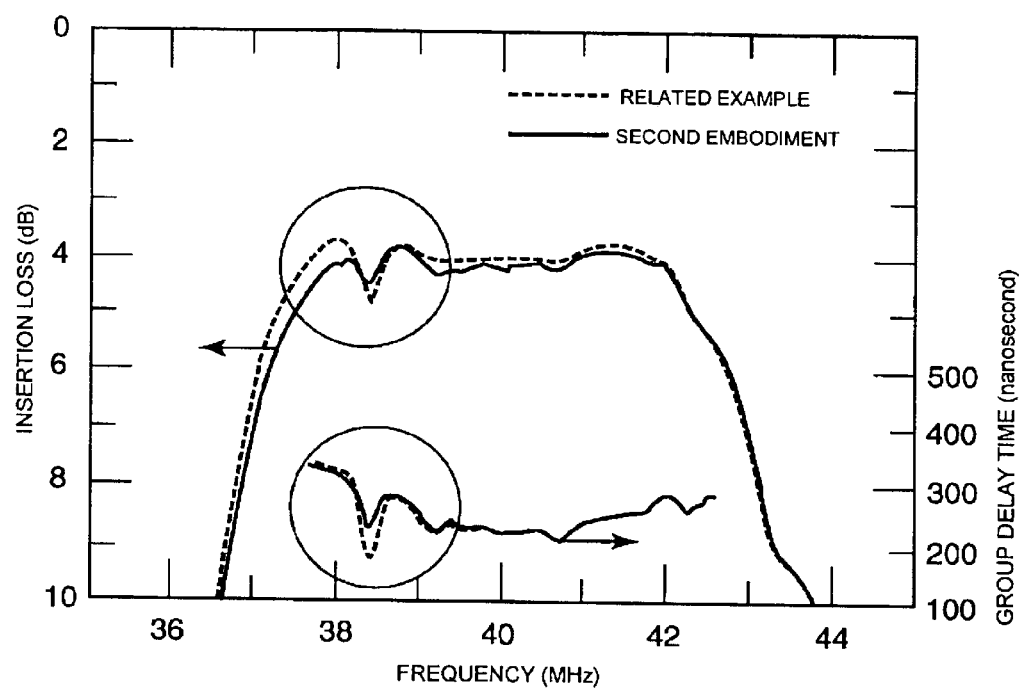
FIG. 10 shows the transmission characteristics of a related example and the longitudinally coupled resonator-type surface acoustic wave device of the second preferred embodiment of the present invention.

FIG. 10 shows the transmission characteristics of the longitudinally coupled resonator-type surface acoustic wave device shown in FIG. 9. In FIG. 10, the solid line shows the results of the second preferred embodiment and the broken line shows the results of a related example. Here, the related example is constructed in the same manner as the longitudinally coupled resonator-type surface acoustic wave filter portion 12 except that the related example does not include an electrically discontinuous portion or a floating electrode.

As clearly shown in FIG. 10, similar to the first preferred embodiment, in the second preferred embodiment, a ripple caused by a transverse mode is effectively suppressed when compared with the related example having no electrically discontinuous portion or floating electrode.

Figure 11:
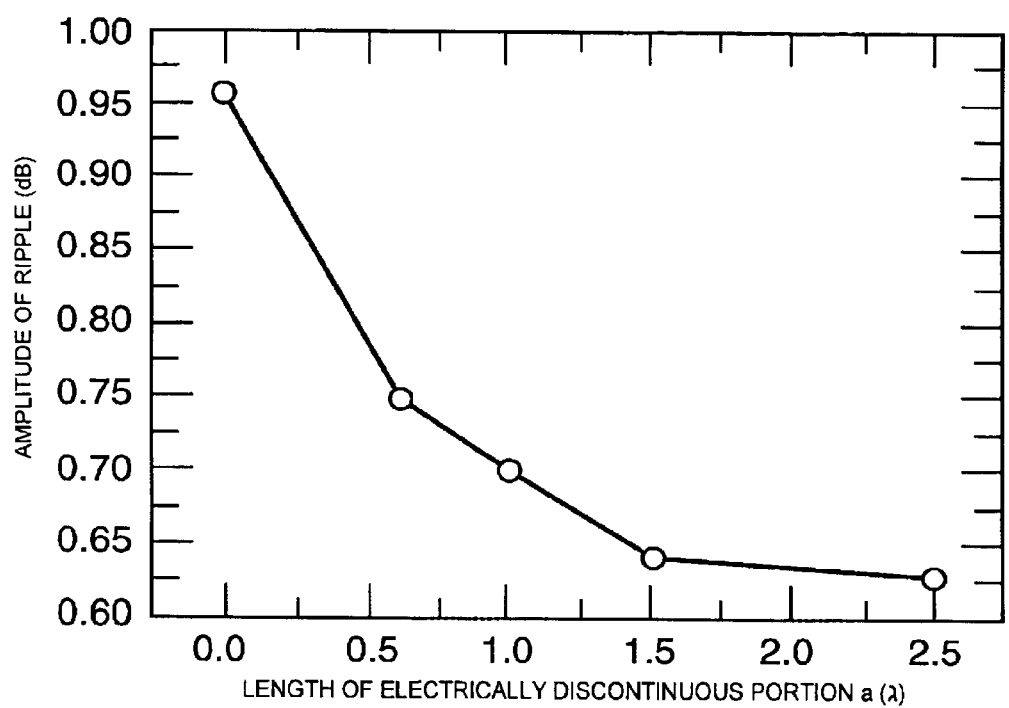
FIG. 11 shows the change in amplitude of the ripple when the length a of the electrically discontinuous portion is changed in the second preferred embodiment of the present invention.

FIG. 11 shows the change in amplitude of a ripple caused by a transverse mode when the length a of the electrically discontinuous portion is varied in the longitudinally coupled resonator-type surface acoustic wave device 11 of the second preferred embodiment. Moreover, the amplitude of a ripple represents the evaluation of the amplitude of a ripple in the transmission characteristics as shown in FIG. 8.

As shown in FIG. 11, when the length a is at least about 0.6λ, a ripple caused by a transverse mode is effectively suppressed. More preferably, when the length a is at least about 1.0λ, an unwanted ripple is more effectively suppressed.

Figure 12:
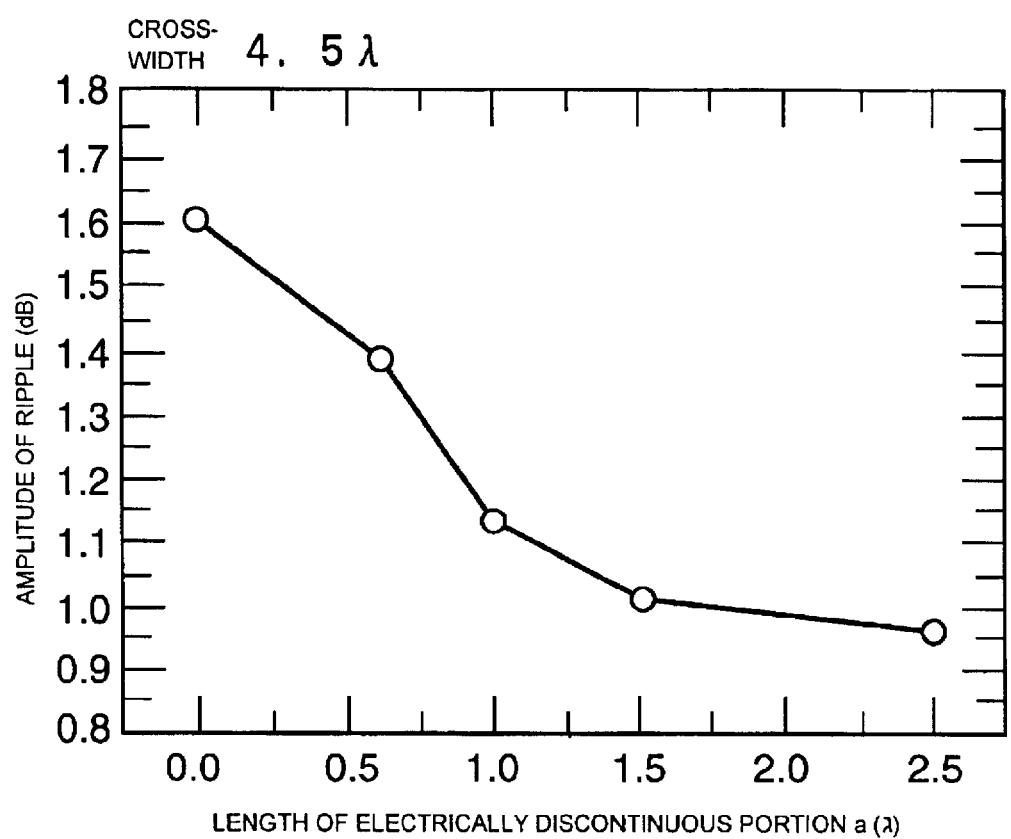
FIG. 12 shows the relation between the length a of the electrically discontinuous portion and the amplitude of the ripple appearing in the transmission characteristic when the number of pairs of IDT electrode fingers and the finger overlap are changed in the construction of the second preferred embodiment of the present invention.

FIG. 12 shows the relationship between the length a and a ripple existing in the transmission characteristics in the longitudinally coupled resonator-type surface acoustic wave device of the second preferred embodiment in the case where the number of pairs of electrode fingers in the IDT 13A on the input side of the longitudinally coupled resonator-type surface acoustic wave filter portion 13 and in the IDT 4 on the output side of the longitudinally coupled resonator-type surface acoustic wave filter portion 12 is three, where the number of pairs of electrode fingers in the other IDTs 13B and 3 is 4, and where the finger overlap of the electrode fingers is about 4.5λ.

As shown in FIG. 12, where the number of pairs of electrode fingers and the finger overlap of electrode fingers are different, in the same manner as in FIG. 11, when the length a is at least about 0.6λ, and more preferably when the length a is at least about 1.0λ, an unwanted ripple in the transmission characteristics caused by a transverse mode is effectively suppressed.

That is, as is clear by comparing FIGS. 11 and 12, even if the number of pairs and finger overlap of electrode fingers in the IDTs are changed, when the length a is at least about 0.6λ, and more preferably when the length a is at least about 1.0λ, the ripple is more effectively suppressed.

Figure 13:
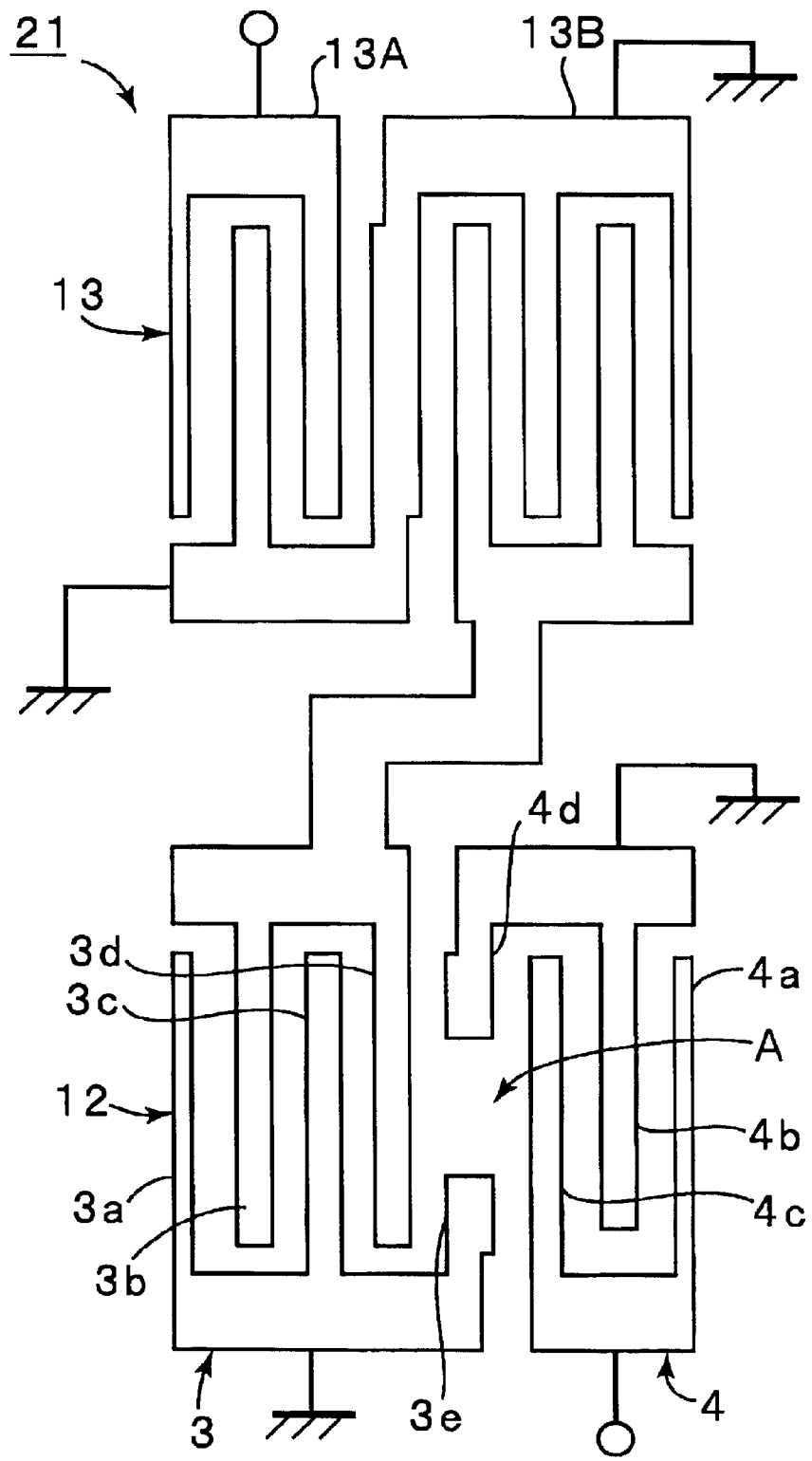
FIG. 13 is a schematic top view showing the construction of electrodes in a longitudinally coupled resonator-type surface acoustic wave device according to a third preferred embodiment of the present invention.

FIG. 13 is a schematic top view showing the construction of electrodes of a longitudinally coupled resonator-type surface acoustic wave device according to a third preferred embodiment of the present invention. In the longitudinally coupled resonator-type surface acoustic wave device 21 of the third preferred embodiment, the floating electrode 5 in the longitudinally coupled resonator-type surface acoustic wave filter of the second preferred embodiment is omitted. The other construction is the same as in the second preferred embodiment.

As is clear from the third preferred embodiment, a floating electrode is not necessarily required in the electrically discontinuous portion in the present invention. That is, the electrically discontinuous portion A may be defined by a portion where no electrode finger portion exists.

As described above, in the first to third preferred embodiments, a ripple caused by a transverse mode is effectively suppressed by providing an electrically discontinuous portion between adjacent electrode fingers of adjacent IDTs or by providing a floating electrode in the electrically discontinuous portion.

Figure 14:
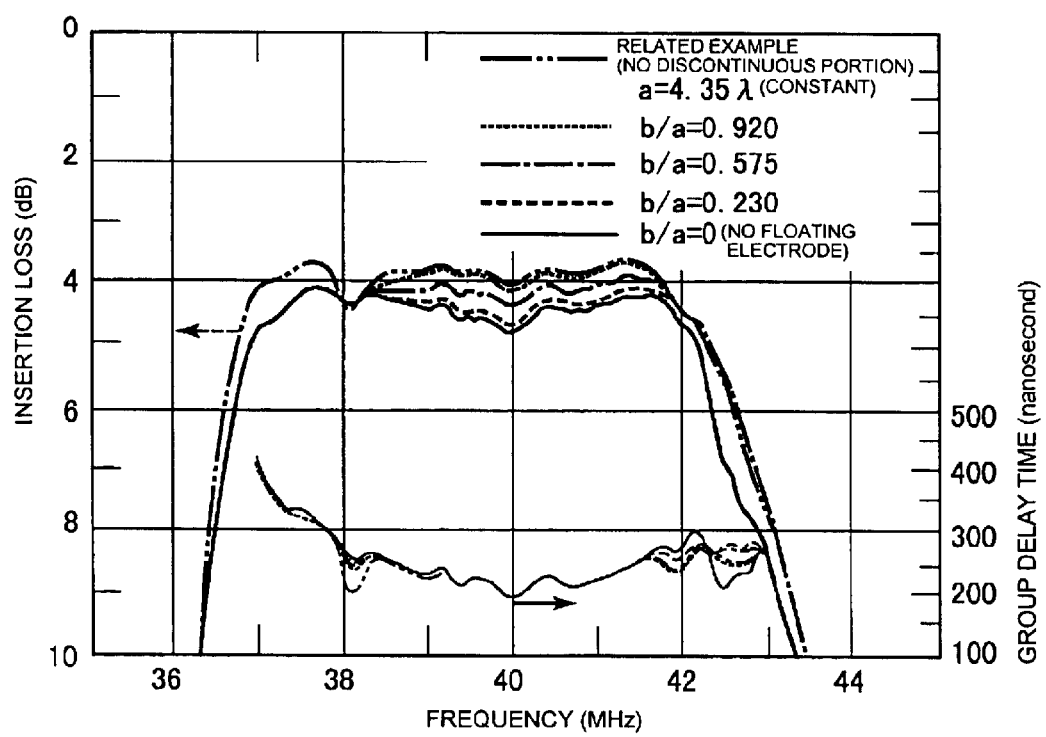
FIG. 14 shows the attenuation-to-frequency characteristic and the GDT-to-frequency characteristics of a related longitudinally coupled resonator-type surface acoustic wave device in which no electrically discontinuous portion is provided, a longitudinally coupled resonator-type surface acoustic wave device in which an electrically discontinuous portion is provided, and longitudinally coupled resonator-type surface acoustic wave devices in which floating electrodes of various lengths are disposed in an electrically discontinuous portion.
Figure 15:
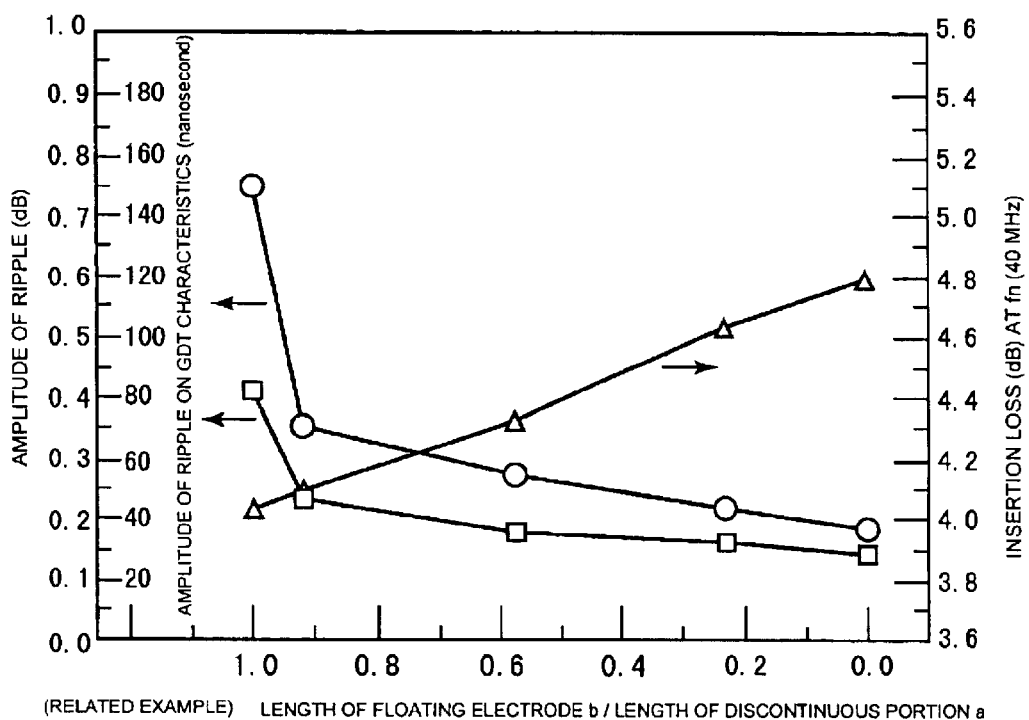
FIG. 15 is the data representing the results of FIG. 14 in another way and the horizontal axis represents the ratio of the length b of a floating electrode to the length a of an electrically discontinuous portion, and which shows the change in amplitude of a ripple caused by a transverse mode appearing in the attenuation-to-frequency characteristic, the amplitude of a ripple caused by a transverse mode appearing in the GDT-to-frequency characteristic, and the loss at 40 MHz.

FIGS. 14 and 15 show the transmission characteristics of a related longitudinally coupled resonator-type surface acoustic wave device in which no discontinuous portion is provided, longitudinally coupled resonator-type surface acoustic wave devices in which a discontinuous portion is provided according to preferred embodiments of the present invention and the ratio b/a of the length b in the finger overlap direction of a floating electrode to the length a of the discontinuous portion a is varied, and a longitudinally coupled resonator-type surface acoustic wave device in which a discontinuous portion is provided, but no floating electrode is provided as in the third preferred embodiment.

FIG. 15 shows the results of FIG. 14 in another manner, that is, FIG. 15 shows the change of the amplitude (dB) of a ripple existing in the attenuation versus frequency characteristics, the amplitude (nanosecond) of a ripple existing in the GDT characteristics, and the insertion loss at the center frequency of about 40 MHz when the ratio of the length b of the floating electrode to the length a of the discontinuous portion is varied in each longitudinally coupled resonator-type surface acoustic wave device.

As shown in FIGS. 14 and 15, wherein b/a=0 corresponding to the third preferred embodiment in which no floating electrode is provided, a ripple caused by a transverse mode is effectively suppressed in the same manner as in the case in which a floating electrode is provided. However, when no floating electrode is provided, the insertion loss increases at the higher frequency side of the passband. Accordingly, it is desirable to provide a floating electrode in the electrically discontinuous portion.

Furthermore, when a floating electrode is provided, based on the results in FIGS. 14 and 15, the loss at about 40 MHz is reduced if the ratio b/a of the length b of the floating electrode to the length a of the discontinuous portion is at least about 0.575, that is, at least about 57.5%. That is, while the ripple is improved, the insertion loss is reduced on the higher frequency side of the ripple in the passband. Accordingly, the ratio b/a is preferably at least about 57.5%.

The present invention is not limited to the first to third preferred embodiments.

Figure 16:
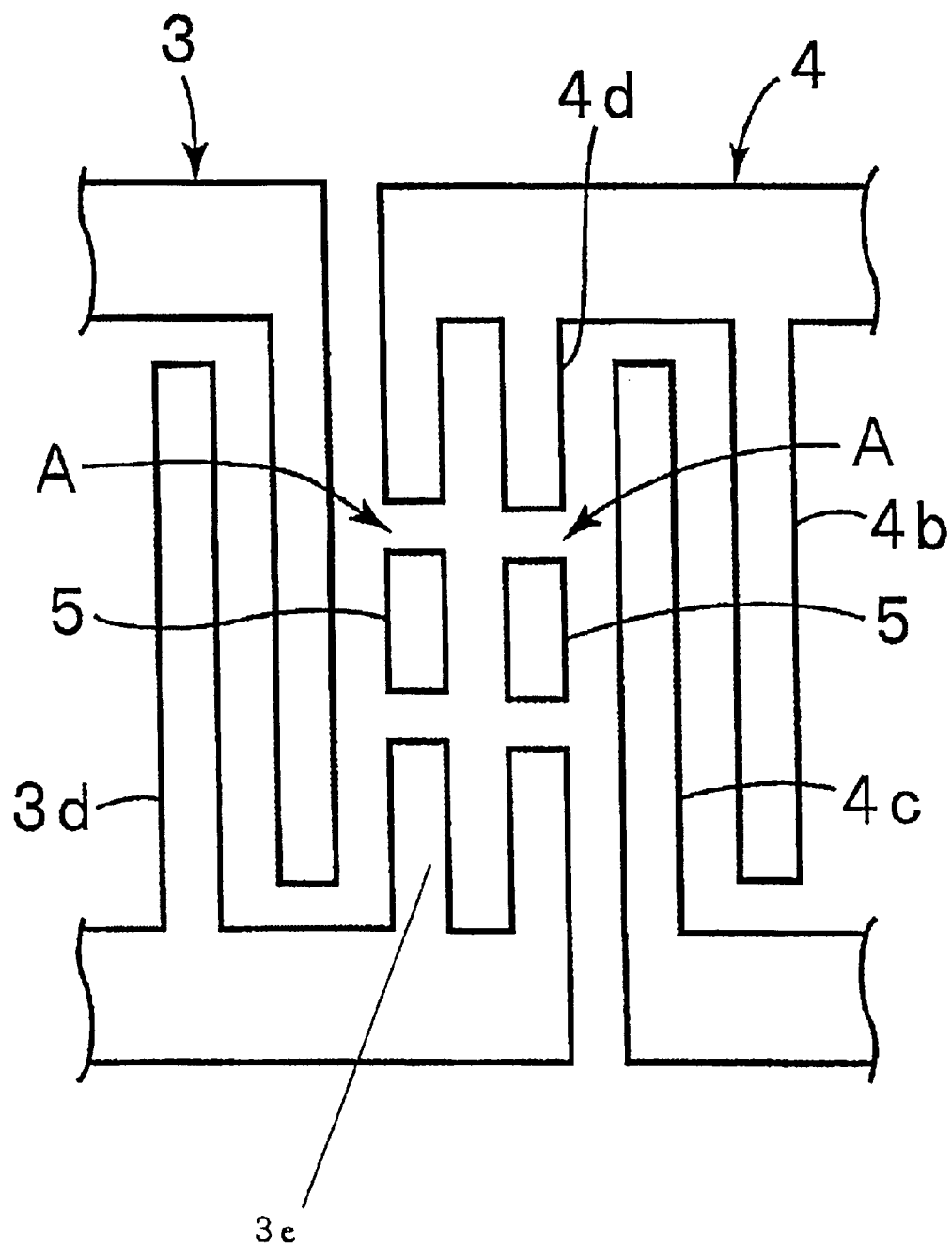
FIG. 16 is a partially cutaway top view for showing a modified example of a longitudinally coupled resonator-type surface acoustic wave device of preferred embodiments of the present invention.

For example, as shown in FIG. 16, in the present invention, the adjacent IDTs 3 and 4 may be arranged farther from each other than in the first to third preferred embodiments. That is, in the first preferred embodiment, singe although the distance between the centers of the electrode fingers which are arranged outermost in the IDTs 3 and 4 is about 0.2λ, the distance may be changed, and the electrode finger 3e of the IDT 3 and the electrode finger 4d of the IDT 4 may be arranged side by side, as shown in FIG. 16. In this case, electrically discontinuous portions A and floating electrodes 5 are provided for the adjacent electrode fingers 3e and 4d in the same manner as in the above-describe preferred embodiments. Moreover, in the modified example shown in FIG. 16, it is not necessary to provide the floating electrodes.

Furthermore, in the first and second preferred embodiments and the above-described modified example, one floating electrode 5 is provided for the electrically discontinuous portions A, but a plurality of floating electrodes 5 may be provided in the finger overlap direction in the electrically discontinuous portion A.

Moreover, the present invention can be applied not only to the end surface reflection-type surface acoustic wave devices as in the first to third preferred embodiments, but also to longitudinally coupled resonator-type surface acoustic wave devices where reflectors are provided outside the area provided with IDTs.

Furthermore, regarding the number of IDTs, a plurality of IDTs may be provided in the surface acoustic wave propagation direction, and, not only two IDTs, but also three or more IDTs may be provided. Moreover, when three or more IDTs are arranged in the surface acoustic wave propagation direction, the construction in which an electrode finger having an electrically discontinuous portion provided in adjacent IDTs is not required in all of the locations where the IDTs are adjacent to each other.

As described above, in a longitudinally coupled resonator-type surface acoustic wave device according to a first preferred embodiment of the present invention, an electrically discontinuous portion is provided in the central portion in the finger overlap direction in adjacent electrode fingers of adjacent IDTs and at least one floating electrode is disposed in the finger overlap direction, and accordingly, a ripple caused by a transverse mode is effectively suppressed. In addition, the electrically discontinuous portion and floating electrode are required only in the area of the adjacent electrode fingers, and no special construction is required in the remainder of the IDTs. Therefore, a ripple caused by a transverse mode is suppressed without significantly affecting the principal propagation mode.

In a longitudinally coupled resonator-type surface acoustic wave device according to a second preferred embodiment of the present invention, a surface acoustic wave substrate and IDTs, which are disposed in the propagation direction of a surface acoustic wave on the surface acoustic wave substrate and each of which includes a plurality of electrode fingers, are provided and, in adjacent electrode fingers of adjacent IDTs, an electrically discontinuous portion is provided in the central portion in the finger overlap direction, and, as a result, a ripple caused by a transverse mode is effectively suppressed. In addition, the electrically discontinuous portion is provided only in the area of the adjacent electrode fingers, and no special construction is required in the remainder of the IDTs. Therefore, a ripple caused by a transverse mode is effectively suppressed without substantially affecting the principal propagation mode.

It should be understood that the foregoing description is only illustrative of the present invention. Various alternatives and modifications can be devised by those skilled in the art without departing from the present invention. Accordingly, the present invention is intended to embrace all such alternatives modifications and variances which fall within the scope of the appended claims.

What is claimed is:

1. A longitudinally coupled resonator-type surface acoustic wave device comprising:

a surface acoustic wave substrate; and a plurality of interdigital transducers, each of said plurality of interdigital transducers having a plurality of electrode fingers which are disposed in the propagation direction of a surface acoustic wave propagating on the surface acoustic wave substrate; wherein an electrically discontinuous portion is provided in a central portion of a finger overlap direction at adjacent electrode fingers of said plurality of electrode fingers of adjacent interdigital transducers and at least one floating electrode is provided in a finger overlap direction in the electrically discontinuous portion.

2. A longitudinally coupled resonator-type surface acoustic wave device as set forth in claim 1, wherein a ratio b/a is at least about 0.575, where the length in the finger overlap direction of the electrically discontinuous portion is indicated by "a" and the length in the finger overlap direction of the floating electrode is indicated by "b".

3. A longitudinally coupled resonator-type surface acoustic wave device as set forth in claim 1, wherein each electrode finger portion on both sides in the finger overlap direction of the electrically discontinuous portion is connected to one of the adjacent interdigital transducers.

4. A longitudinally coupled resonator-type surface acoustic wave device as set forth in claim 1, wherein a length in the finger overlap direction of the electrically discontinuous portion is at least about $0.6\lambda$.

5. A longitudinally coupled resonator-type surface acoustic wave device as set forth in claim 1, wherein a length in the finger overlap direction of the electrically discontinuous portion is about 7.5% to about 87.5% of the finger overlap.

6. A longitudinally coupled resonator-type surface acoustic wave device as set forth in claim 1, wherein the surface acoustic wave substrate includes two opposing end surfaces at which a surface acoustic wave is reflected.

7. A longitudinally coupled resonator-type surface acoustic wave device as set forth in claim 1, wherein the metallization ratio of said plurality of interdigital transducers is about 0.5.

8. A longitudinally coupled resonator-type surface acoustic wave device comprising a plurality of longitudinally coupled resonator-type surface acoustic wave devices, at least one of the plurality of longitudinally coupled resonator-type surface acoustic wave devices is a longitudinally coupled resonator-type surface acoustic wave device as set forth in claim 1.

9. A communication device comprising a longitudinally coupled resonator-type surface acoustic wave device as set forth in claim 1 which constitutes a bandpass filter.

* * * * *